United States Patent
Schneider et al.

(10) Patent No.: US 10,971,639 B2
(45) Date of Patent: Apr. 6, 2021

(54) METHOD OF MOUNTING AN ELECTRICAL COMPONENT ON A BASE PART

(71) Applicant: SICK AG, Waldkirch (DE)

(72) Inventors: Florian Schneider, Waldkirch (DE); Bernd Deblitz, Waldkirch (DE)

(73) Assignee: SICK AG, Waldkirch (DE)

( * ) Notice: Subject to any disclaimer, the term of this patent is extended or adjusted under 35 U.S.C. 154(b) by 27 days.

(21) Appl. No.: 16/506,025

(22) Filed: Jul. 9, 2019

(65) Prior Publication Data
US 2020/0027998 A1  Jan. 23, 2020

(30) Foreign Application Priority Data
Jul. 23, 2018 (DE) .......................... 102018117695.3

(51) Int. Cl.
*H01L 31/024* (2014.01)
*H01L 31/0203* (2014.01)
*H01L 31/18* (2006.01)

(52) U.S. Cl.
CPC ........ *H01L 31/024* (2013.01); *H01L 31/0203* (2013.01); *H01L 31/18* (2013.01)

(58) Field of Classification Search
CPC .... H01L 31/024; H01L 31/0203; H01L 31/18
USPC ....................................................... 257/433
See application file for complete search history.

(56) References Cited

U.S. PATENT DOCUMENTS

| 5,472,353 A | 12/1995 | Hristake et al. |
| 2004/0206478 A1* | 10/2004 | Delano ............... H01L 23/4338 165/81 |
| 2005/0047092 A1 | 3/2005 | Whit et al. |
| 2013/0003316 A1 | 1/2013 | Martin |
| 2014/0133093 A1 | 5/2014 | Cox et al. |
| 2016/0242322 A1 | 8/2016 | Wong et al. |
| 2017/0363371 A1 | 12/2017 | David |

FOREIGN PATENT DOCUMENTS

| DE | 8711779 U1 | 1/1988 |
| DE | 102006037747 A1 | 3/2008 |
| DE | 102007049035 A1 | 4/2009 |

OTHER PUBLICATIONS

German Search Report dated May 10, 2019 corresponding to application No. 102018117695.3.

* cited by examiner

*Primary Examiner* — Elias Ullah
(74) *Attorney, Agent, or Firm* — Nath, Goldberg & Meyer; Jerald L. Meyer

(57) ABSTRACT

A method of mounting an electrical component on a base part having an inclined support surface is provided, in which method a first wedge surface of a wedge element is arranged on the support surface and a lateral force is exerted on the wedge element so that the first wedge surface moves on the support surface until a second wedge surface of the wedge element remote from the support surface reaches a desired position, and wherein the electrical component is arranged on the second wedge surface. In this respect, a first fastening element of the wedge element is fixed to the base part and the lateral force is afterward no longer exerted.

14 Claims, 3 Drawing Sheets

METHOD OF MOUNTING AN ELECTRICAL COMPONENT ON A BASE PART

FIELD

The invention relates to a method of mounting an electrical component on a base part having an inclined support surface, and to an electrical apparatus in whose manufacture the method is used.

BACKGROUND

The thermal link of electrical components is an important aspect that has to be considered in the design and in the manufacture of a sensor to ensure its function. In this respect, where possible, the electrical consumers are directly connected to the sensor housing to keep the device's own heating as small as possible. At an increased device temperature, there is a threat of losses in the efficiency of optoelectrical components such as lasers or LEDs, of a degradation of the signal-to-noise ratio at light receivers and image sensors, and of a shortened service life. In addition, the electrical components have to be operated in a specified temperature range.

Mechanical tolerances occur in the mounting and/or in the assembly. There is thus the additional challenge that the temperature link of the electrical components should not be impaired wherever possible by such tolerances.

A conventional possibility of dealing with such tolerances is an individual treatment from device to device in the mounting. For this purpose, the components are first assembled without any heat transfer material and the distance between the electrical component and the heat sink is measured The components are then taken apart again, the large tolerances are compensated by a copper sheet selected with reference to the measured distance, and a thin thermally conductive film is added before the components are then screwed together. The copper sheets are present in staggered thicknesses. Such an individual process is very complex and/or expensive and is additionally susceptible to faults.

Another possibility of compensating tolerances with a good thermal link is represented by thermally conductive pipes (heat pipes) that are, however, likewise associated with relatively high costs.

US 2017/0363371 A1 discloses a self-adjusting cooling module having two wedges that are disposed over one another with a solid thermal interface material therebetween. A spring laterally presses against one of the wedges and the two wedges thereby jam while compensating tolerances between an electronic component located above and a heat sink arranged below. However, this has some disadvantages. The heat transfer between the wedges is impaired by the indirect lateral force effect by means of the spring and the heat sink is constantly mechanically loaded via the lever of the wedges. Due to the two wedges, the temperature flow from the electronic component up to the heat sink has to overcome a plurality of interfaces. A spring having long term stability is required that exerts a defined force over the entire service life.

SUMMARY

It is therefore the object of the invention to improve the mounting of an electrical component.

This object is satisfied by a method of mounting an electrical component on a base part and by an electrical apparatus. The base part has an inclined support surface and a first wedge surface of a wedge element is arranged thereon. A lateral force is now exerted on this wedge element. The force acts from the narrow side of the wedge element so that a force component causes the wedge element to move upwardly on the support surface until a second wedge surface of the wedge element disposed opposite the first wedge surface reaches a desired position. The electrical component is arranged on the second wedge surface. Expressed in illustrative terms, the wedge element moves on the slope for so long until its upper side lies at a desired height for the contact with the electrical component. For this purpose, the wedge angle of the wedge element preferably just corresponds to the angle of the inclined support surface so that the second wedge surface is horizontally oriented.

The invention starts from the basic idea of carrying out the tolerance compensation via the wedge element only once during the mounting and then to maintain the reached position. For this purpose, when the second wedge surface has reached the desired position, at least one first fastening element of the wedge element is fixed to the base part, in particular by one or more screws. The lateral force is subsequently no longer exerted. The wedge element is held in the desired position by the first fastening element and means for a lateral force effect with the localizing of a desired position are thus only required during assembly and then no longer.

The invention has the advantage that mechanical tolerances for an improved thermal link of the electrical component are compensated in a simple manner. It is neither necessary to use thick thermally conductive pads having a poor thermal conductivity nor to individually select and insert a thermally conductive metal sheet of a specific thickness for each device. The heat flow over the one wedge element is good and the fixing has long term stability with the most simple fastening means such as screws.

The electrical component preferably has a circuit board. The circuit board is mounted with one or more electrical components whose heat is to be dissipated. The mechanical tolerances to be compensated occur due to the stacking of circuit boards, for example.

The base part is preferably configured as a housing part. It can thus dissipate the heat directly outwardly. Alternatively, the base part is preferably at least thermally linked to the housing part.

The wedge element and/or the base part preferably comprise thermally conductive material. They are in particular manufactured from metal for this purpose. A good thermal bridge from the electrical component to the outside is produced.

The wedge element is preferably disposed directly on the base part. There are therefore no further components therebetween, in particular no thermally conductive pad conventionally to be provided for the compensation of tolerances. This is not necessary because the wedge element already satisfies its object by adopting the desired position.

Thermally conductive material is preferably arranged between the electrical component and the second wedge surface. While the first wedge surface is fixed on the base part and a leak tight link is ensured in this manner, thermally conductive material at the interface between the wedge and the electrical component can again help to improve the thermal link, to compensate further tolerances, and to avoid mechanical strains on the possibly sensitive electrical component. It is, however, here only a question of small tolerances and therefore a thin layer of the thermally conductive material since the larger portion has already been compensated by the wedge.

The first fastening element preferably forms a connection perpendicular to the support surface and to the first wedge surface. A direct, perpendicular connection and a force effect between the wedge element and the base part having a correspondingly good thermal transfer is therefore provided. The lateral force could not do this; it only has a partial component in this substantial direction during the service life of the mounted device. A simple implementation option is a first fastening element that is itself oriented as perpendicular, in particular a perpendicular screw connection. A certain inclined position, for example for better accessibility by a tool, is, however, still possible.

The electrical component is preferably arranged on the base part to predefine the desired position during the exertion of the lateral force. The electrical component that is moved into its destination position in this manner itself specifies the desired position of the wedge element. The lateral force presses said wedge element, while compensating the tolerances with the second wedge surface, upward up to the lower side of the electrical component or, if desired, of a thermally conductive material. The wedge element is then fixed to the base part at this position. The electrical component preferably has at least one opening through which the first fastening element is fixed. Alternatively, the wedge element can have lateral fastening regions that remain accessible for a tool for fixing the first fastening element.

A template having a geometry corresponding to the electrical component is preferably first arranged on the base part in front of the electrical component to predefine the desired position during the exertion of the lateral force. Certain mechanical loads that can impair an electrical component such as a mounted circuit board do not damage the template during the tolerance compensation with the lateral force and the fixing of the wedge element. In addition, the template can be configured such that it provides simple access for the fixing of the first fastening element. The coincidence of the geometry of the template and that of the electrical component only relates to the regions that are relevant to the support on the second wedge surface and to the fastening on the base part so that there is otherwise freedom to provide openings and the like for tool access.

The template is then preferably removed when the first fastening element of the wedge element is fixed to the base part. Instead of the template, at least one fixed fastening element of the electrical component is fixed, in particular screwed, to the base part. In the case of a circuit board, the mounted electrical components now lie on the second wedge surface as was measured using the template and its waste heat is thus dissipated through the wedge element into the base part and further to the outside. The template can take account of a defined spacing for a thermally conductive pad or the like between the electrical component and the second wedge element.

In a preferred further development, a method of manufacturing a sensor is provided in which at least one electrical component is mounted on at least one base part using one of the embodiments of the method in accordance with the invention. The sensor is preferably an optoelectronic sensor, in particular a camera that can be configured as a code reader. The electrical component can be a circuit board having a light source, a light receiver, or an image sensor and other electronic components for a data exchange, for supply, or for control and/or evaluation functions.

In an electrical apparatus in accordance with the invention, in particular a sensor of the kind named in the previous paragraph, at least one electrical component is mounted on at least one base part of the sensor with a wedge element therebetween in accordance with the method in accordance with the invention.

BRIEF DESCRIPTION OF THE DRAWINGS

The invention will be explained in more detail in the following also with respect to further features and advantages by way of example with reference to embodiments and to the enclosed drawing. The Figures of the drawing show in.

DETAILED DESCRIPTION

Figure 1:
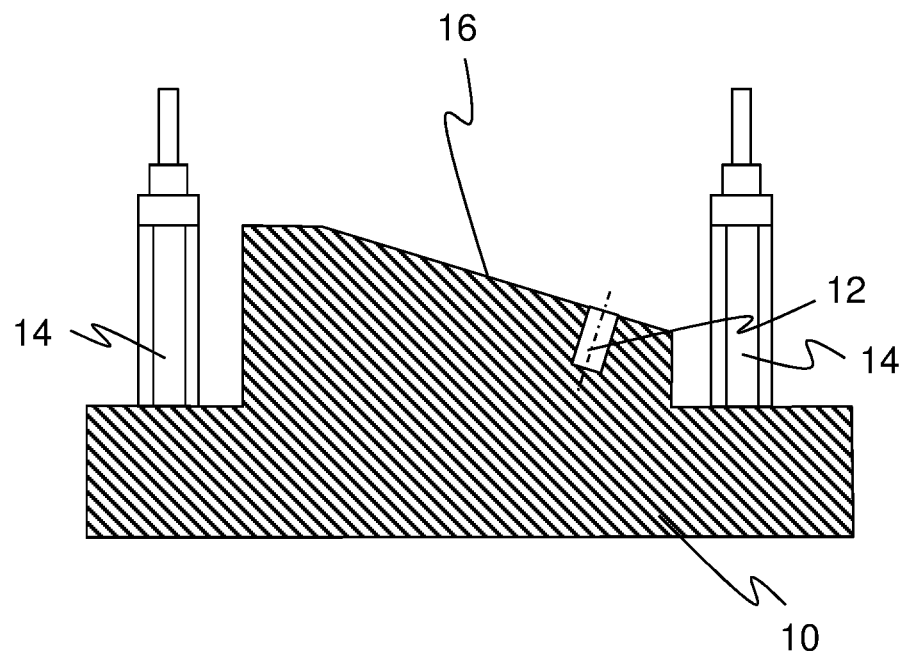
FIG. 1 a sectional representation of a base part with an inclined support surface.

FIG. 1 shows a sectional representation of a base part 10 of an electrical apparatus, in particular of a sensor. The base part 10 is preferably a housing part composed of metal or of another thermally conductive material; alternatively thermally connected to a housing or to another heat sink. An electrical component is to be mounted on the base part 10 and is to be cooled by a good thermal connection, for example a mounted circuit board having components such as an FPGA, a microprocessor, a light source or a light receiver, for instance such as one or more photodiodes or APDs (avalanche photodiodes) or an image sensor.

The base part 10 has an opening 12 for a first fastening element, wherein a plurality of openings 12 are also possible for a plurality of first fastening elements depending on the dimensions. Two fastening elements 14 are furthermore provided for the electrical component. The base part 10 has an inclined support surface 16 at the upper side where the electrical component is mounted. With a smooth, horizontal upper side, the electrical component would only be mounted thereon with a large mechanical tolerance that is avoided in accordance with the invention by the inclined support surface 16 and the further steps explained in the following with reference to FIGS. 2 to 6 for the assembly of the electrical component.

Figure 2:
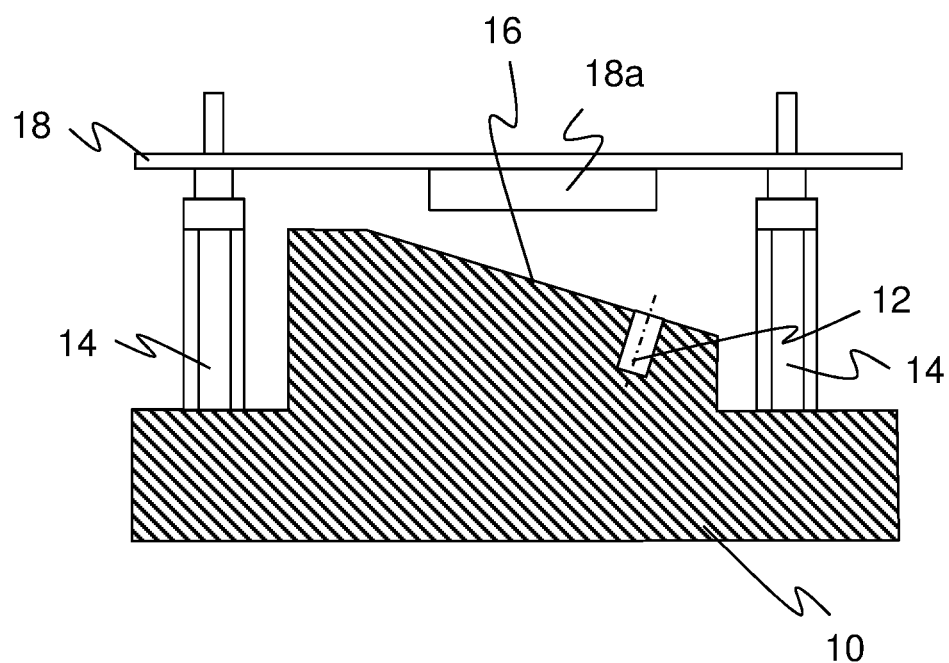
FIG. 2 a sectional representation of the base part with an applied template of an electrical component.

FIG. 2 shows a further sectional representation of the base part 10 in which a template 18 is placed onto the base part 10. For this purpose here, the second fastening elements 14 are used, but the template 18 could also be differently moved into its destination position. The template 18 has the same geometry, at least in the later support and fastening regions, as the electrical component to be mounted, in this example a mounted circuit board. The electronic components located on the circuit board are represented on the template 18 by a material block 18a that has the dimensions of the electronic components and possibly additionally of a thermally conductive material to be arranged thereon.

Figure 3:
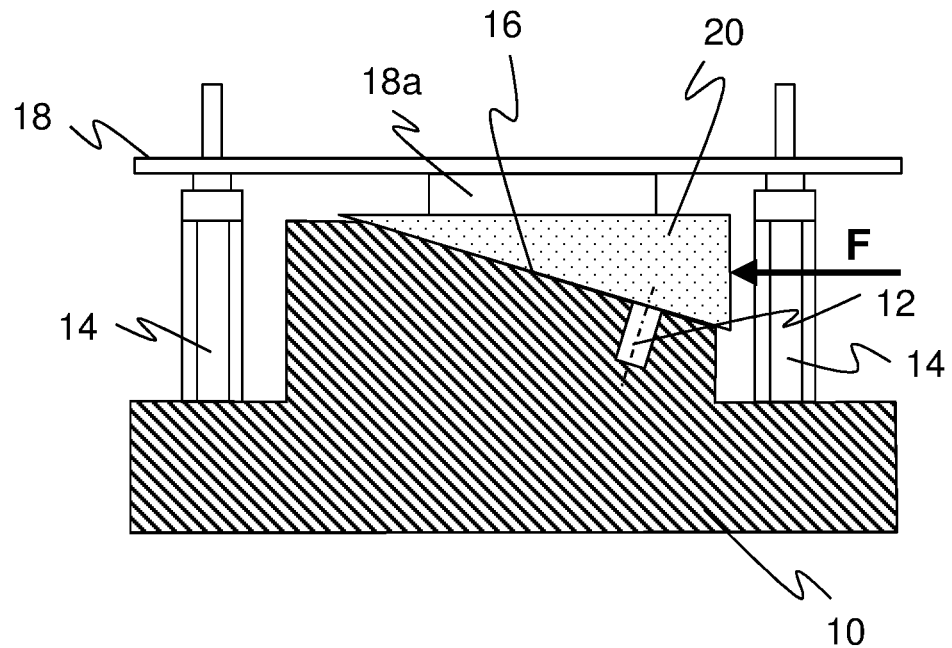
FIG. 3 a sectional representation in which a metal wedge is introduced between the base part and the template and is pressed on by a lateral force.

FIG. 3 shows a further sectional view in which now a wedge element 20, preferably composed of metal or of another thermally conductive material, is laterally introduced such that its lower surface lies on the inclined support surface 16. A defined lateral force F is exerted from the narrow side of the wedge element 20 and the wedge element 20 moves so far by it into the intermediate space until the lower surface of the wedge element 20 is still pressed onto the inclined surface 16 and the upper surface of the wedge element 20 is still pressed onto the template 18 or onto the material block 18a. The template 18 thus predefines the desired position of the wedge element 20 and in particular the height of its upper surface at which a support is achieved with a tolerance compensation.

Figure 4:
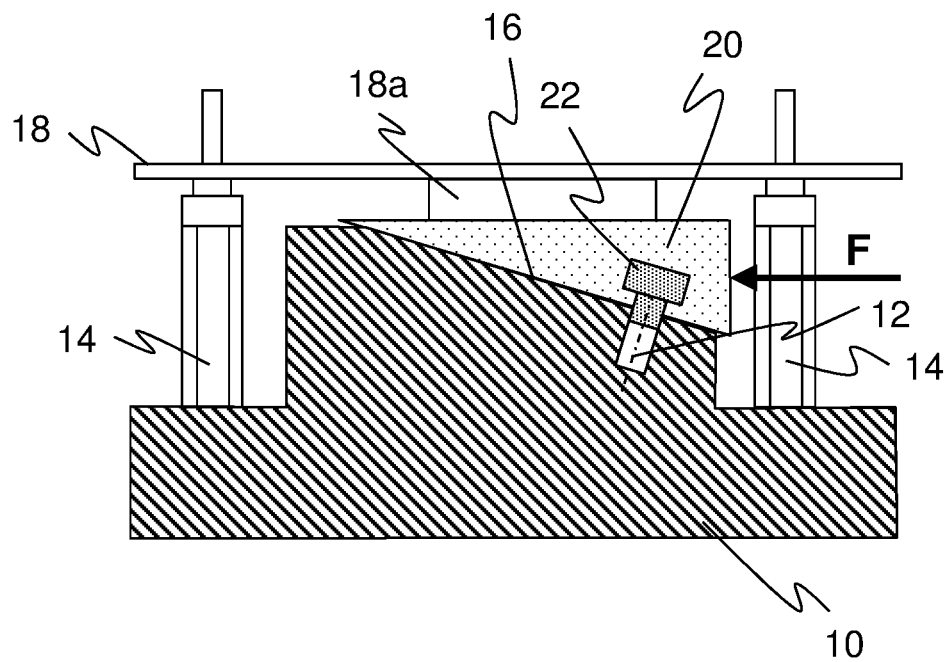
FIG. 4 a sectional representation in which the metal wedge is fixed in a destination position.

FIG. 4 shows a further sectional view in which a first fastening element 22 of the wedge element 20 is fixed to the base part 10. In this example, the first fastening element 22 is a screw that is screwed into the opening 12. The template 18 can be configured such that a tool access for the fixing of the first fastening element 22 is facilitated, for example by corresponding openings and cutouts that the electrical component possibly does not have. An ideal thermal transition between the base part 10 and the wedge element 20 is established by the direct, perpendicular force effect of the first fastening element 22. The fixed pressing at the contact surfaces also makes a thermal material that is conceivable per se superfluous between the base part 10 and the wedge element 20.

Figure 5:
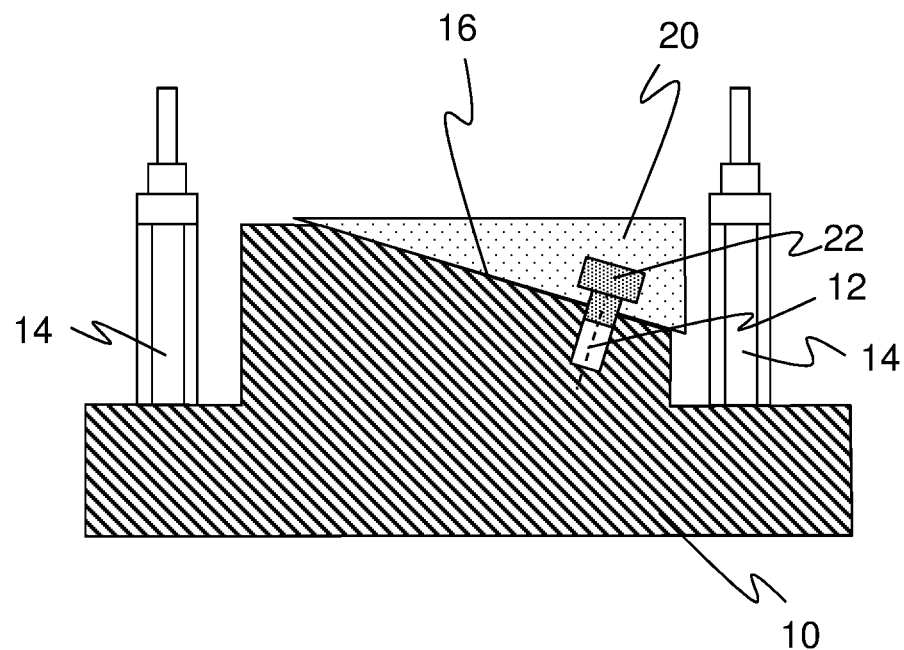
FIG. 5 a sectional representation in which the lateral force is no longer exerted and the template is removed after the fixation.

FIG. 5 shows a sectional view in which the template 18 is removed again after fixing the wedge element 20 to the base part 10 in the desired position for the tolerance compensation. In addition, the effect of the lateral force is no longer required.

Figure 6:
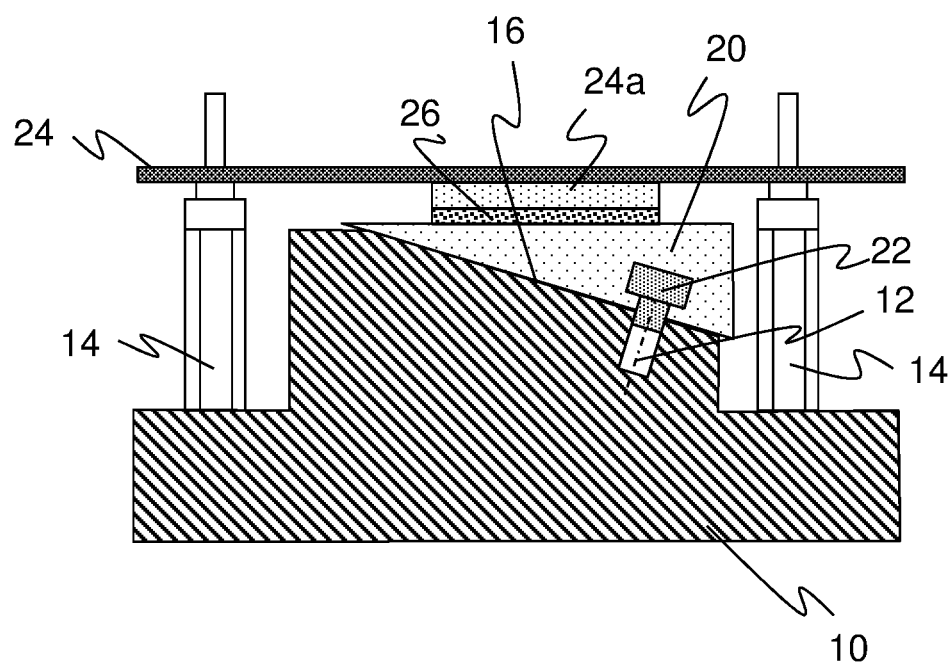
FIG. 6 a sectional representation in which the electrical component is placed on instead of the template and is fastened to the base part.

FIG. 6 shows a sectional view in which the electrical component 24, in this case a circuit board that is mounted with an electronic component 24a and that adopts the position defined by the template 18. The electrical component 24 is fixed, in particular screwed, to the base part 10 with the aid of the second fastening elements 14. Thermally conductive material 26, for example a temperature pad or a thermally conductive paste, or both, such as a polyamide film with paste, is preferably arranged between the electrical component 24 and the wedge element 20. Remaining tolerances of the electrical component 24 or of the circuit board and its mounting can thus be compensated. A typical extent of the thermally conductive material 26 can be taken into account in the material block 18a of the template 18.

Alternatively to a height adaptation by means of the template 18, the electrical component 24 can also be directly applied to the base part 10 in the step described with reference to FIG. 2. However, there must then be a possibility of fixing the first fastening element 22 of the wedge element 20 on the base part 10 with a supported electrical component 24. Accessibility can be provided, for example, by openings in the electrical component 24 or of the circuit board, by an overhang of the wedge element 20 having the openings 12, or via a lateral deflection mechanism. The steps described with reference to FIGS. 5 and 6 are omitted in this alternative embodiment; the exertion of the lateral force F can simply be set in the state in accordance with FIG. 4; however, with the template 18 replaced with the electrical component 24.

The invention claimed is:

1. A method of mounting an electrical component on a base part, said base part having an inclined support surface in which method a first wedge surface of a wedge element is arranged on the support surface and a lateral force is exerted on the wedge element so that the first wedge surface moves on the support surface until a second wedge surface of the wedge element remote from the support surface reaches a desired position,
wherein the electrical component is arranged on the second wedge surface,
and wherein a first fastening element fixes the wedge element to the base part in the desired position, with means for exerting the lateral force on the wedge element being removed after fixing the wedge element to the base part so that the lateral force is no longer exerted after assembly.

2. The method in accordance with claim 1, wherein the electrical component has a circuit board.

3. The method in accordance with claim 1, wherein the base part is configured as a housing part.

4. The method in accordance with claim 1, wherein at least one of the wedge element and the base part comprises thermally conductive material.

5. The method in accordance with claim 1, wherein the wedge element lies directly on the base part.

6. The method in accordance with claim 1, wherein thermally conductive material is arranged between the electrical component and the second wedge surface.

7. The method in accordance with claim 1, wherein the first fastening element forms a connection perpendicular to the support surface and the first wedge surface.

8. The method in accordance with claim 1, wherein the electrical component is arranged on the base part to predefine the desired position during the exertion of the lateral force.

9. The method in accordance with claim 1, wherein a template having a geometry corresponding to the electrical component is first arranged before the electrical component on the base part to predefine the desired position during the exertion of the lateral force.

10. The method in accordance with claim 9, wherein the template is removed when the first fastening element of the wedge element is fixed to the base part.

11. The method in accordance with claim 9, wherein the template is removable when the first fastening element of the wedge element is fixed to the base part.

12. A method of manufacturing a sensor in which method at least one electrical component is mounted on at least one base part, each base part having an inclined support surface, in which method a first wedge surface of a wedge element is arranged on the support surface and a lateral force is exerted on the wedge element so that the first wedge surface moves on the support surface until a second wedge surface of the wedge element remote from the support surface reaches a desired position,
wherein the electrical component is arranged on the second wedge surface, and
and wherein a first fastening element fixes the wedge element to the base part in the desired position, with means for exerting the lateral force on the wedge element being removed after fixing the wedge element to the base part so that the lateral force is no longer exerted after assembly.

13. An electrical apparatus having at least one electrical component and having at least one base part,
wherein the electrical component is mounted on the base part with a wedge element therebetween, each base part having an inclined support surface,
wherein a first wedge surface of said wedge element is arranged on the inclined support surface and the wedge element is configured such that a lateral force can be exerted thereon so that the first wedge surface can move on the support surface until a second wedge surface of the wedge element remote from the support surface reaches a desired position, wherein the electrical component is arranged on the second wedge surface, and wherein a first fastening element fixes the wedge element to the base part in the desired position, with means for exerting the lateral force on the wedge element being removed after fixing the wedge element to die base part so that the lateral force is no longer exerted after assembly.

14. The electrical apparatus in accordance with claim 13, wherein the electrical apparatus is an optoelectronic sensor.

* * * * *